United States Patent
Huang et al.

(10) Patent No.: US 7,150,313 B2
(45) Date of Patent: Dec. 19, 2006

(54) HEAT DISSIPATION DEVICE

(75) Inventors: Yu-Nien Huang, Chungli (TW); Yu Liu, Taoyuan (TW)

(73) Assignee: Quanta Computer Inc., Tao Yuan Shien (TW)

( * ) Notice: Subject to any disclaimer, the term of this patent is extended or adjusted under 35 U.S.C. 154(b) by 106 days.

(21) Appl. No.: 10/937,609

(22) Filed: Sep. 10, 2004

(65) Prior Publication Data

US 2005/0067152 A1 Mar. 31, 2005

(30) Foreign Application Priority Data

Sep. 26, 2003 (TW) .............................. 92126722 A

(51) Int. Cl.
*H01L 23/36* (2006.01)
*H01L 23/467* (2006.01)
*H05K 7/20* (2006.01)
*F28F 7/00* (2006.01)

(52) U.S. Cl. ............... 165/121; 165/122; 165/80.3; 165/185; 361/697; 454/184

(58) Field of Classification Search ........... 165/121, 165/122, 80.3, 185; 361/697; 454/184
See application file for complete search history.

(56) References Cited

U.S. PATENT DOCUMENTS

| | | | | |
|---|---|---|---|---|
| 4,765,397 A | * | 8/1988 | Chrysler et al. | 165/104.33 |
| 4,884,630 A | * | 12/1989 | Nelson et al. | 165/170 |
| 4,953,634 A | * | 9/1990 | Nelson et al. | 165/147 |
| 5,957,194 A | * | 9/1999 | Azar | 165/80.3 |
| 6,089,315 A | * | 7/2000 | Lee et al. | 165/185 |
| 6,313,399 B1 | * | 11/2001 | Suntio et al. | 174/17 VA |
| 6,333,852 B1 | * | 12/2001 | Lin | 361/697 |
| 6,343,016 B1 | * | 1/2002 | Lin | 361/704 |
| 6,643,129 B1 | * | 11/2003 | Fujiwara | 361/687 |
| 6,913,069 B1 | * | 7/2005 | Barsun et al. | 165/80.3 |
| 6,935,419 B1 | * | 8/2005 | Malone et al. | 165/185 |
| 2002/0174980 A1 | * | 11/2002 | DiBene et al. | 165/185 |
| 2003/0155106 A1 | * | 8/2003 | Malone et al. | 165/121 |

FOREIGN PATENT DOCUMENTS

JP 05-206339 A * 8/1993
JP 2003-197834 A * 7/2003

* cited by examiner

*Primary Examiner*—John K. Ford
(74) *Attorney, Agent, or Firm*—Rabin & Berdo, P.C.

(57) ABSTRACT

A heat dissipation device is described. The heat dissipation device is suitable for electrical equipment, and particularly for a notebook computer. The heat dissipation device has a cooling fan and a plurality of heat dissipation fins. The heat dissipation fins are disposed at an outlet of the cooling fan to exhaust heat on the heat dissipation fins with airflow generated by the cooling fan. Each of spaces between the adjacent heat dissipation fins is determined so as to make the airflow velocity uniform. A preferred predetermined space is about $C_1 \times 1/(V^2-1)$, where V is an original airflow velocity at the adjacent heat dissipation fins and $C_1$ is a coefficient.

13 Claims, 2 Drawing Sheets

HEAT DISSIPATION DEVICE

BACKGROUND

1. Field of the Invention

The present invention relates to a heat dissipation device, and more particularly, to a heat dissipation device with adjusted heat dissipation fins.

2. Description of Related Art

Information technology and computer industrial are highly developed, and therefore portable devices, such as notebook computers, are popularly utilized for business or private purpose. The portable devices have become lighter, thinner and smaller to satisfy the requirements of a modem conveyable working style. Notebook computers are popularly used by the public, because of their powerful processing of digital information.

Due to improvements in semiconductor process technology, the notebook computer function has gradually become more powerful so that the integrated circuits of central processing unit (CPU) have progressively become more complex. However, the complex integrated circuits may cause serious heat dissipation problems. Therefore, the problem of heat dissipation is more serious for a portable device, and especially for a notebook computer, because the interior space thereof is not enough to maintain sufficient airflow by conventional convection. If a heat dissipation problem exists, the internal temperature of the notebook computer increases. As the internal temperature of the notebook computer increases, the operation system thereof may become unstable and the notebook computer may even crash. More seriously, the hardware thereof may be damaged. Hence, the quick dispersion of internal heat is very important for enhancing the operating efficiency of the notebook computer.

For removing the heat generated by a central processing unit, a conventional heat dissipation device uses a high power cooling fan to force the airflow passing through the heat dissipation fins to exchange heat thereon so as to remove the heat from the computer.

FIG. 1 is an airflow velocity distribution diagram of an outlet of a conventional heat dissipation device for a notebook computer. A conventional heat dissipation device utilizes a cooling fan 110 to force air passing through heat dissipation fins 120 to perform the heat exchange so that the heat generated by a central processing unit can be exhausted out of a notebook computer. However, in the conventional heat dissipation device, the airflow velocity, referred to by the arrows, of the cooling fan 110 is not uniform. In an area A, the airflow velocity 130 is lower and the heat dissipation efficiency is therefore lower because the lower airflow velocity 130 reduces the heat exchange efficiency of the heat dissipation fins 120. However, in an area B, the airflow velocity 130 is higher and the heat dissipation efficiency is therefore increased because the higher airflow velocity 130 increases the heat exchange efficiency of the heat dissipation fins 120. However, the noise in the area B is also increased because the higher airflow velocity 130 makes a louder noise while passing through the heat dissipation fins 120.

SUMMARY

It is an objective of the present invention to provide a heat dissipation device with a uniform outlet airflow velocity to increase a heat dissipation efficiency thereof.

It is another objective of the present invention to provide a heat dissipation device with a uniform outlet airflow velocity to reduce noise of the heat dissipation device.

To accomplish the above objectives, the present invention provides a heat dissipation device. The heat dissipation device includes a cooling fan and a plurality of heat dissipation fins. The heat dissipation fins are disposed at an outlet of the cooling fan to exhaust heat on the heat dissipation fins with an airflow generated by the cooling fan and further remove the heat out of an electrical device with the heat dissipation device according to the present invention. In particular, the heat dissipation device can effectively exhaust the heat generated by a central processing unit out of a notebook computer.

Each space between the adjacent heat dissipation fins is arranged according to a predetermined space so as to form a uniform airflow velocity for removing the heat. The predetermined space is preferably equal to $C_1 * 1/(V^2-1)$ where V is an original airflow velocity of the adjacent heat dissipation fins and $C_1$ is a coefficient.

The heat dissipation device according to the present invention adjusts the spaces of the heat dissipation fins to achieve a uniform airflow velocity so that the top rotational speed can be therefore reduced and the heat dissipation efficiency can be enhanced. Accordingly, the power consumption of the heat dissipation device and the noise thereof can be both reduced.

BRIEF DESCRIPTION OF THE DRAWINGS

The foregoing aspects and many of the attendant advantages of this invention are more readily appreciated as the same becomes better understood by reference to the following detailed description, when taken in conjunction with the accompanying drawings, wherein.

DESCRIPTION OF THE PREFERRED EMBODIMENTS

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
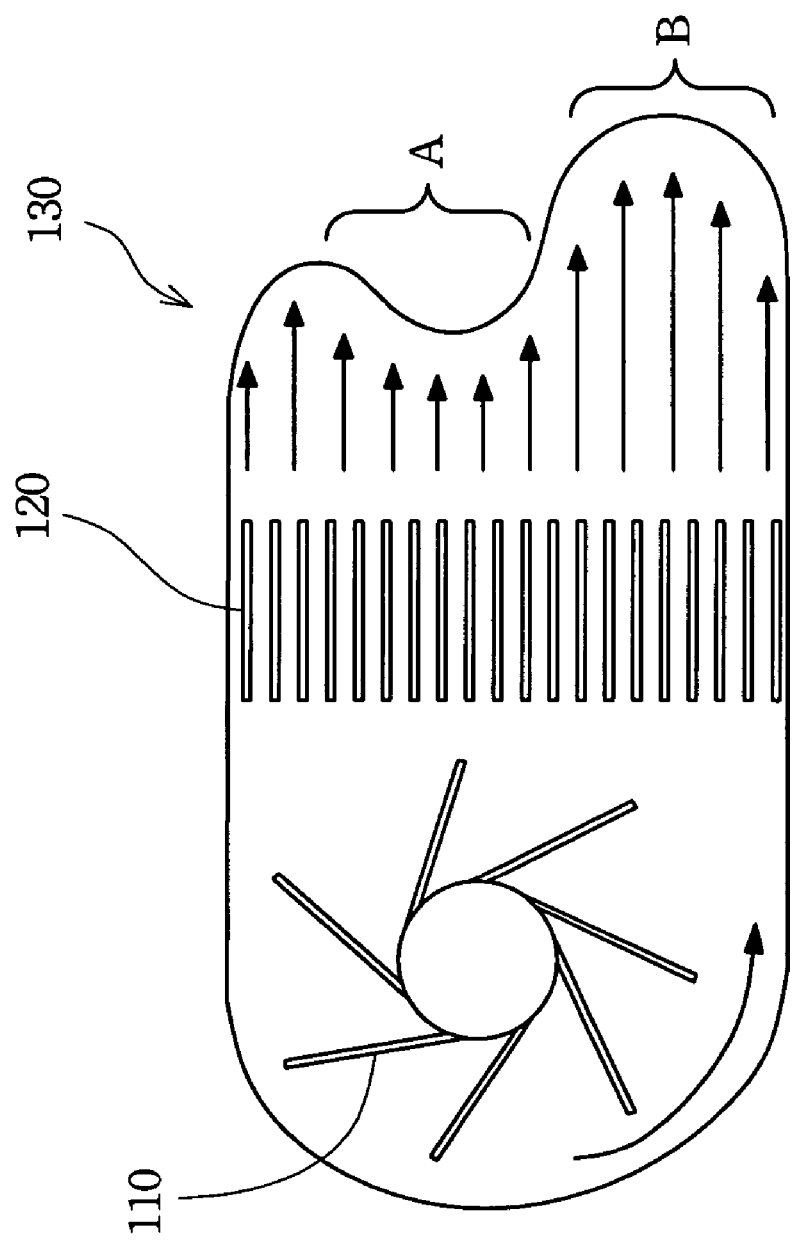
FIG. 1 is an airflow velocity distribution diagram at an outlet of a conventional heat dissipation device for a notebook computer.
Figure 2:
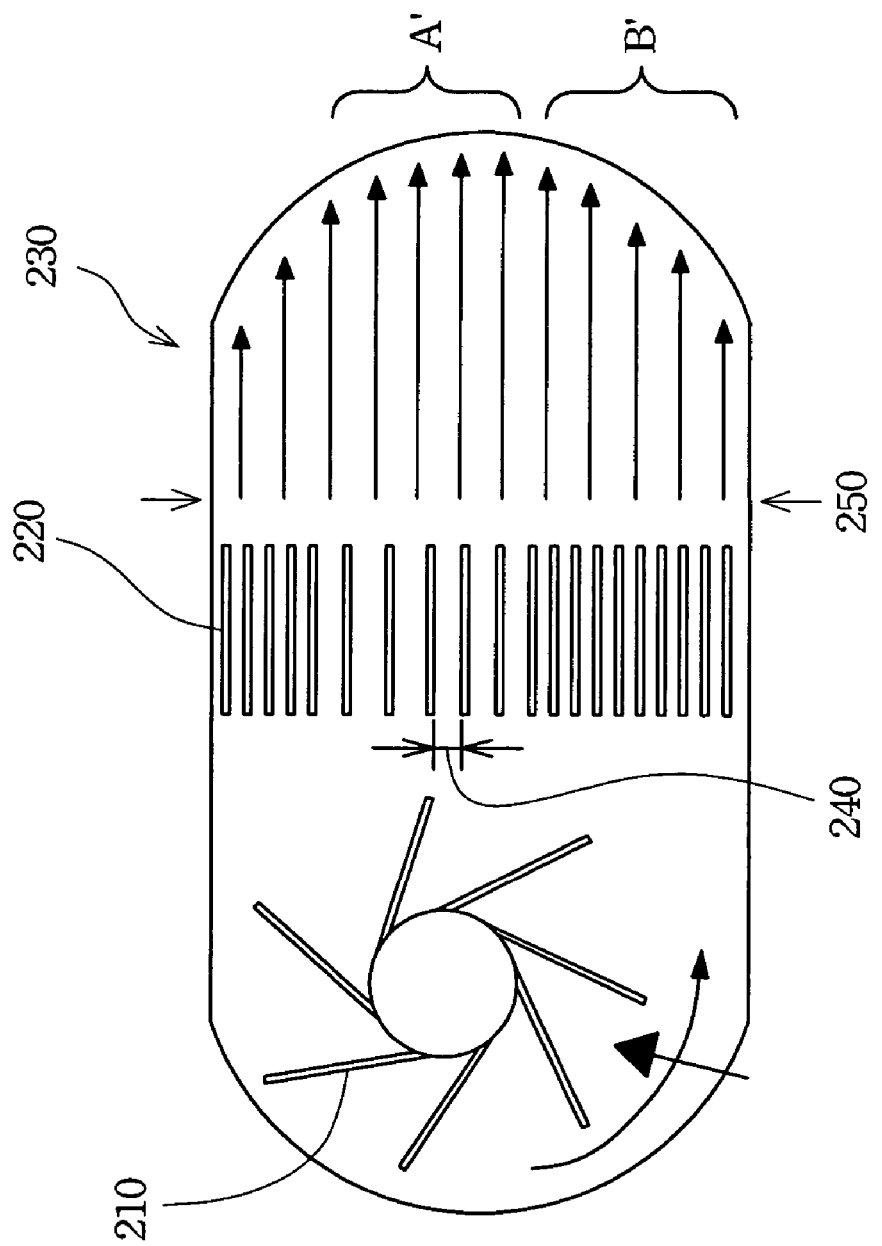
FIG. 2 is an airflow velocity distribution diagram at an outlet of a heat dissipation device according to the present invention.

FIG. 2 is an airflow velocity distribution diagram at an outlet of a heat dissipation device according to the present invention. The heat dissipation device according to the present invention provides a uniform distribution of airflow velocity 230 at an outlet 250 thereof. Spaces 240 of heat dissipation fins 220 of the heat dissipation device are changed to adjust the uniform airflow velocity 230. Referring to FIG. 2, area A' and area B' correspond to area A and area B of FIG. 1. Comparing FIG. 1 and FIG. 2, the distribution of airflow velocity 230 is more uniform than the distribution of airflow velocity 130. Accordingly, the noise caused by the higher airflow velocity can be reduced and the lower heat exchange efficiency caused by the lower airflow velocity can also be eliminated. The heat dissipation device according to the present invention utilizes the uniform airflow velocity 230 to both increase the heat exchange efficiency and reduce the noise problem. A power consumption of the notebook computer with the heat dissipation device according to the present invention can be therefore reduced. In the meantime, the operational stability of the notebook computer is enhanced.

The uniform airflow velocity 230 can be obtained by the following process. First, an equation for a head loss of a developed flow is utilized to calculate the space 240 of the heat dissipation fins 220 for the airflow 230 passing therethrough. The equation is:

$$H = f \times L \times V^2 / (Dh \times 2g) \quad (Eq. 1)$$

where H: head loss
f: friction factor
L: characteristic length (fin length)
V: airflow velocity
g: acceleration of gravity
Dh: equivalent diameter (4*cross-sectional area of airflow path/wetted-perimeter)

The cross-sectional area of airflow path is equal to (space of fins)*(height of fins), and the wetted-perimeter is equal to 2*(space of fins+height of fins).

Because f and g are constants, for easy calculation, f and g are defined as 1 and A represents the space 240 of the fins in the following equation. Furthermore, in the following example, it is assumed that the heat dissipation fins 220 are the same height and same length. Therefore, the height and the length of the heat dissipation fins 220 can be defined as 1. Accordingly, the cross-sectional area of the airflow tunnel can be simplified as A*1, and the wetted-perimeter can be simplified as 2×(A+1). Hence, Eq. 1 can be simplified as follows:

$$H = V^2 / (4(A \times 1)/(2 \times (A+1)) \times 2 \times 1)$$

where H represents a head loss of the heat dissipation fins, a designed value, and is also defined as 1.

Eq. 2 can be derived and simplified from Eq. 1 as follows:

$$A = C_1 \times 1/(V^2 - 1) \quad (Eq. 2)$$

Where $C_1$ is a coefficient for balancing the left side and the right side of Eq. 2.

If A=1 mm and V=2.5 m/s is an expected value of the heat dissipation device, then the coefficient $C_1$ is about $1 \times (2.5^2 - 1) = 5.25$. In the meanwhile, A is about 0.22 mm while V is about 5 m/s. Accordingly, the required space 240 between the heat dissipation fins 220 under required airflow velocity can be obtained by Eq. 2. Therefore, preferred spaces between the heat dissipation fins 220 can be calculated for obtaining a uniform airflow velocity.

When designing the heat dissipation device, the original airflow velocities are measured with non-modified heat dissipation fins, the heat dissipation fins having the same space, at some positions, relative to the cooling fan 210, of the non-modified heat dissipation fins. Then, each of the measured airflow velocities is substituted into Eq. 2, and the spaces for the uniform airflow velocity with respect to these positions can be obtained.

Then, the spaces of the heat dissipation fins are modified according to the calculated result. Therefore, the fin spaces corresponding to higher airflow velocity can be reduced and the fin spaces corresponding to with a lower airflow velocity can be increased. Hence, the noise caused by the higher airflow velocity can be effectively reduced so that the operational environment of the notebook computer with the heat dissipation device according to the present invention can be improved. The user can therefore work more stably and comfortably. Additionally, because the lower airflow velocity can be increased, the heat exchange efficiency with the lower airflow velocity can be enhanced so that the heat dissipation efficiency of the heat dissipation device can be therefore improved.

The heat dissipation device according to the present invention is not limited to the notebook computer, and any electrical device with a similar heat dissipation device can be satisfied with the heat dissipation device according to the present invention to provide a uniform cooling airflow velocity for reducing the noise and increasing the heat exchange efficiency. With the foregoing equation, the present invention can apply to any heat dissipation fins with different heights, different lengths or different widths.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation device, comprising:
a cooling fan comprising an outlet; and
a plurality of heat dissipation fins disposed at the outlet to exhaust heat on the heat dissipation fins with an airflow generated by the cooling fan, wherein all of the heat dissipation fins have a same fin height and a same fin length, and each fin space between adjacent heat dissipation fins is adjusted to form a uniform velocity for the airflow between adjacent pairs of the fins, and wherein the spaces are adjusted by a head loss equation $H = f \times L \times V^2 / (Dh \times 2g)$, where H is a head loss design value, f is a friction factor, L is the fin length, V is a velocity of the airflow, g is an acceleration of gravity, and Dh is 4*(width of the space)*(the fin height)/(2*(the width of the space+the fin height)).

2. The heat dissipation device of claim 1, wherein each of the fin spaces is adjusted by an original velocity of the airflow according to a relative position between the cooling fan and the adjacent heat dissipation fins.

3. The heat dissipation device of claim 2, wherein the fin spaces are different.

4. The heat dissipation device of claim 1, wherein the head loss equation is simplified by setting H=1, f=1, g=1, and L=1, so that the space is proportional to $1/(V^2-1)$, wherein V is an original velocity of the airflow according to a relative position between the cooling fan and the adjacent heat dissipation fins.

5. A heat dissipation device of an electrical equipment for removing heat generated by a heat source of the electrical equipment, the heat dissipation device comprising:
a cooling fan comprising an outlet; and
a plurality of heat dissipation fins disposed at the outlet for receiving the heat, wherein the heat is exhausted out of the electrical equipment at the outlet by an airflow generated by the cooling fan, each of the heat dissipation fins has a fin height and a fin length, each fin space between the adjacent heat dissipation fins is adjusted to form a uniform velocity for the airflow, and the fin spaces are adjusted by a head loss equation $H = f \times L \times V^2 / (Dh \times 2g)$, where H is a head loss design value, f is a friction factor, L is the fin length, V is a velocity of the airflow, g is an acceleration of gravity, and Dh is 4*(width of the space)*(the fin height)/(2*(the width of the space+the fin height)).

6. The heat dissipation device of claim 5, wherein each of the fin spaces is adjusted by an original velocity of the airflow according to a relative position between the cooling fan and the adjacent heat dissipation fins.

7. The heat dissipation device of claim 6, wherein the spaces are different.

8. The heat dissipation device of claim 5, wherein the head loss equation is simplified by setting H=1, f=1, g=1, and L=1 so that the width of the space is proportional to $1/(V^2-1)$, wherein V is an original velocity of the airflow according to a relative position between the cooling fan and the heat dissipation fins.

9. The heat dissipation device of claim 5, wherein the heat source is a central processing unit of a notebook computer.

10. A notebook computer with a heat dissipation device, the notebook computer comprising:
   a central processing unit for processing data so as to generate heat;
   a heat dissipation device coupling to the central processing unit to remove the heat out of the notebook computer, the heat dissipation device further comprising:
   a cooling fan comprising an outlet; and
   a plurality of heat dissipation fins disposed at the outlet for receiving the heat generated by the central processing unit and exhausting the heat from the notebook computer by an airflow generated by the cooling fan, wherein each of the heat dissipation fins has a fin height and a fin length, each fin space between the adjacent heat dissipation fins is adjusted to form a uniform velocity for the airflow, and the fin spaces are adjusted by a head loss equation $H=f \times L \times V^2/(Dh \times 2g)$, where H is a head loss design value, f is a friction factor, L is the fin length, V is a velocity of the airflow, g is an acceleration of gravity, and Dh is 4*(width of the space)*(the fin height)/(2*(the width of the space+the fin height)).

11. The notebook computer with a heat dissipation device of claim 10, wherein each of the fin spaces is adjusted by an original velocity of the airflow according to a relative position between the cooling fan and the adjacent heat dissipation fins.

12. The notebook computer with a heat dissipation device of claim 11, wherein the fin spaces are different.

13. The notebook computer with a heat dissipation device of claim 10, wherein the head loss equation is simplified by setting H=1, f=1, g=1, and L=1 so that the space is proportional to $1/(V^2-1)$, wherein V is an original velocity of the airflow according to a relative position between the cooling fan and the adjacent heat dissipation fins.

* * * * *